United States Patent
Ng et al.

(10) Patent No.: US 7,521,981 B2
(45) Date of Patent: Apr. 21, 2009

(54) MIXER WITH CARRIER LEAKAGE CALIBRATION

(75) Inventors: Choon Yong Ng, Singapore (SG); Ee Sze Khoo, Singapore (SG)

(73) Assignee: Mediatek Singapore Pte Ltd, Ayer Rajah Crescent (SG)

( * ) Notice: Subject to any disclaimer, the term of this patent is extended or adjusted under 35 U.S.C. 154(b) by 0 days.

(21) Appl. No.: 11/760,986

(22) Filed: Jun. 11, 2007

(65) Prior Publication Data

US 2008/0303579 A1 Dec. 11, 2008

(51) Int. Cl.
*G06G 7/12* (2006.01)

(52) U.S. Cl. .................. 327/355; 327/359; 327/362; 455/333

(58) Field of Classification Search ......... 327/355–362; 455/326, 333
See application file for complete search history.

(56) References Cited

U.S. PATENT DOCUMENTS

| 6,801,761 | B2 | 10/2004 | Khorram |
| 7,012,457 | B2* | 3/2006 | Moran et al. ................. 327/359 |
| 2007/0069928 | A1* | 3/2007 | Gehring et al. ............. 341/118 |

* cited by examiner

*Primary Examiner*—Dinh T. Le
(74) *Attorney, Agent, or Firm*—Thomas, Kayden, Horstemeyer & Risley

(57) ABSTRACT

A mixer circuit. The mixer circuit comprises a double-balanced mixer and a carrier-leakage calibration cell. The double-balanced mixer has first and second input pairs whereby the first input pair receives the first differential input signal. The carrier-leakage calibration cell receives the second differential input signal and a differential calibration current and generates first and second output voltages to the second input pair of the double-balanced mixer.

10 Claims, 5 Drawing Sheets

MIXER WITH CARRIER LEAKAGE CALIBRATION

BACKGROUND OF THE INVENTION

1. Field of the Invention

The invention relates to a double-balanced mixer and, in particular, to a double-balanced mixer with a dynamic current steering cell.

2. Description of the Related Art

Mixer circuits for high frequency application constructed using metal oxide semiconductor (MOS) transistors are subject to a limited voltage supply (usually less than 2V) and high levels of flicker noise, having frequencies extending up to several tens of MHz. Accordingly, the gain and output signal levels required in such mixer circuits exceed those allowed in the equivalent bipolar circuits.

FIG. 1 is a circuit diagram illustrating a conventional double-balanced mixer circuit. The double-balanced mixer circuit in FIG. 1 includes differential pairs of MOSFETs (Q131-Q132 and Q133-Q134). The drains of the pairs of MOSFETs are connected to an output terminal (Output-I$^+$ and Output-I$^-$). The gates of the pairs of MOSFETs are connected to first input terminals (Input-II$^+$ and Input-II$^-$). The double-balanced mixer circuit in FIG. 1 also includes active devices Q135, Q136, Q137 and Q138. The sources of the MOSFET pair Q131-Q132 are connected to the drains of the active devices Q135 and Q136. The sources of the MOSFET pair Q133-Q134 are connected to the drains of the active devices Q137 and Q138. The gates of the active devices Q135, Q136, Q137 and Q138 are connected to the second input terminal (Input-I$^+$ and Input-I$^-$). The sources of the active devices Q135, Q136, Q137 and Q138 are connected to the ground through an impedance unit (Degeneration Impedance). A quadrature modulator (QMOD) configured with two conventional double-balanced mixer circuits in FIG. 1 in quadrature modulates baseband I/Q signals onto a carrier and generates modulated RF signals. As is known, in a direct-conversion transmitter the carrier signal which is of same frequency as the RF can leak to the output terminal of the QMOD. This carrier-leakage is a result of the DC-offset of I/Q input signals, device mismatches as well as through direct substrate coupling. Bit-error rate (BER) of the QMOD can be degraded unless a specific carrier-suppression requirement is met.

FIG. 2 is a circuit diagram of a conventional programmable mixer as disclosed in U.S. Pat. No. 6,801,761. As shown in FIG. 2, the conventional programmable mixer comprises first and second mixing stages 130 and 132, a coupling element 136 coupled therebetween, and a compensation module 134 coupled to the first and second mixing stages 130 and 132. The compensation module provides current mode compensation to the first and second mixing stages 130 and 132. Current from mixing stages 130 and 132 is substantially equalized by the addition of compensation current using current-sink or through injection via current-source to subtract current from the mixing stages 103 and 132.

BRIEF SUMMARY OF THE INVENTION

An embodiment of a mixer circuit comprises a double-balanced mixer and a carrier-leakage calibration cell. The double-balanced mixer has first and second input pairs whereby the first input pair receives the first differential input signal. The carrier-leakage calibration cell receives the second differential input signal and a differential calibration current and generates first and second output voltages to the second input pair of the double-balanced mixer.

An embodiment of a quadrature mixer circuit comprises first and second mixer circuits. The first differential input signals of the first and second mixer circuits have a phase difference of 90°.

Embodiments according to the invention provide a mixer circuit with carrier-leakage calibration. In the embodiments, local oscillator (LO) signal coupling to a differential output signal of the mixer circuit is significantly suppressed. In addition, this carrier-leakage calibration has negligible degradation in the matching between an I-Quad mixer and a Q-Quad mixer in a quadrature mixer circuit.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
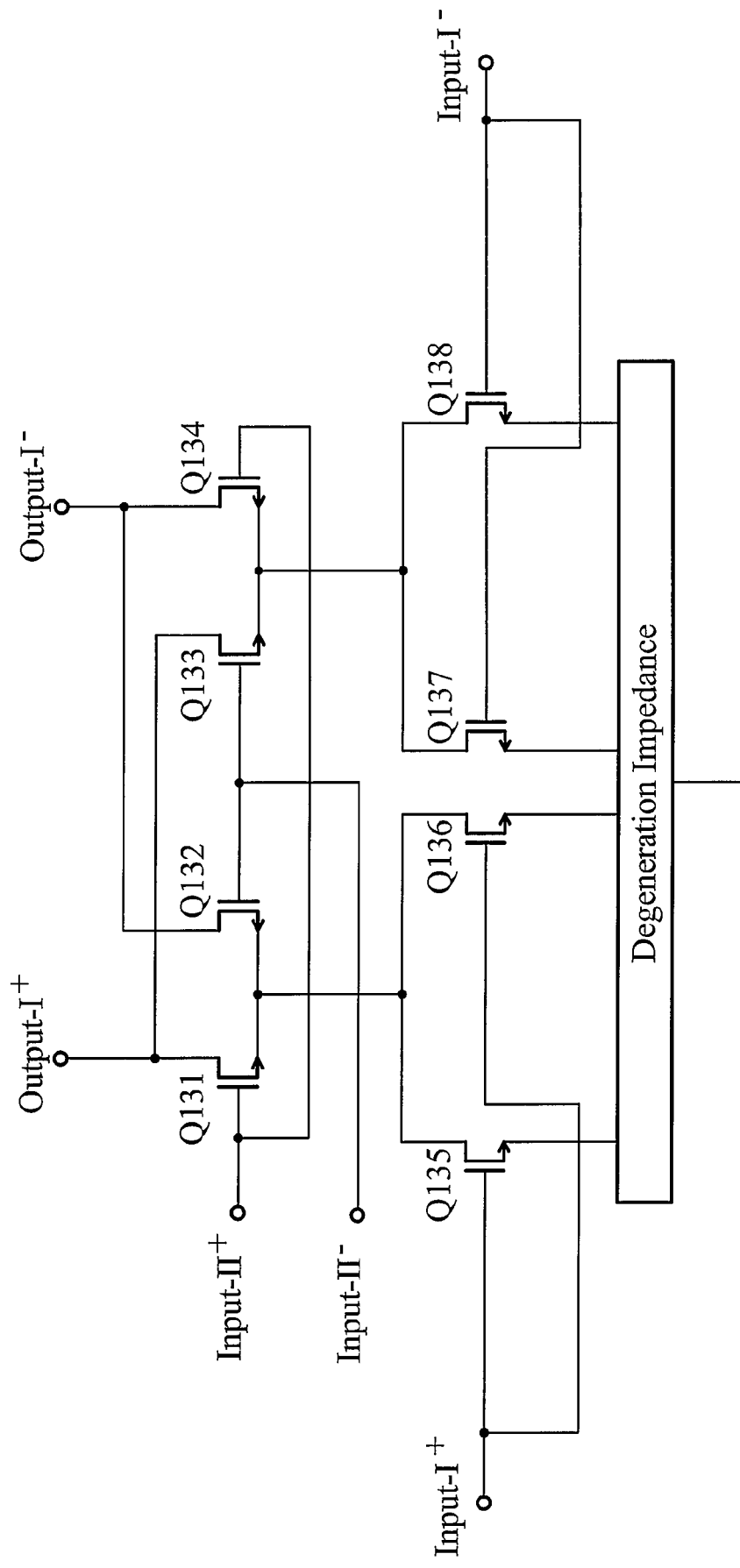
FIG. 1 is a circuit diagram illustrating a conventional double-balanced mixer circuit.
Figure 2:
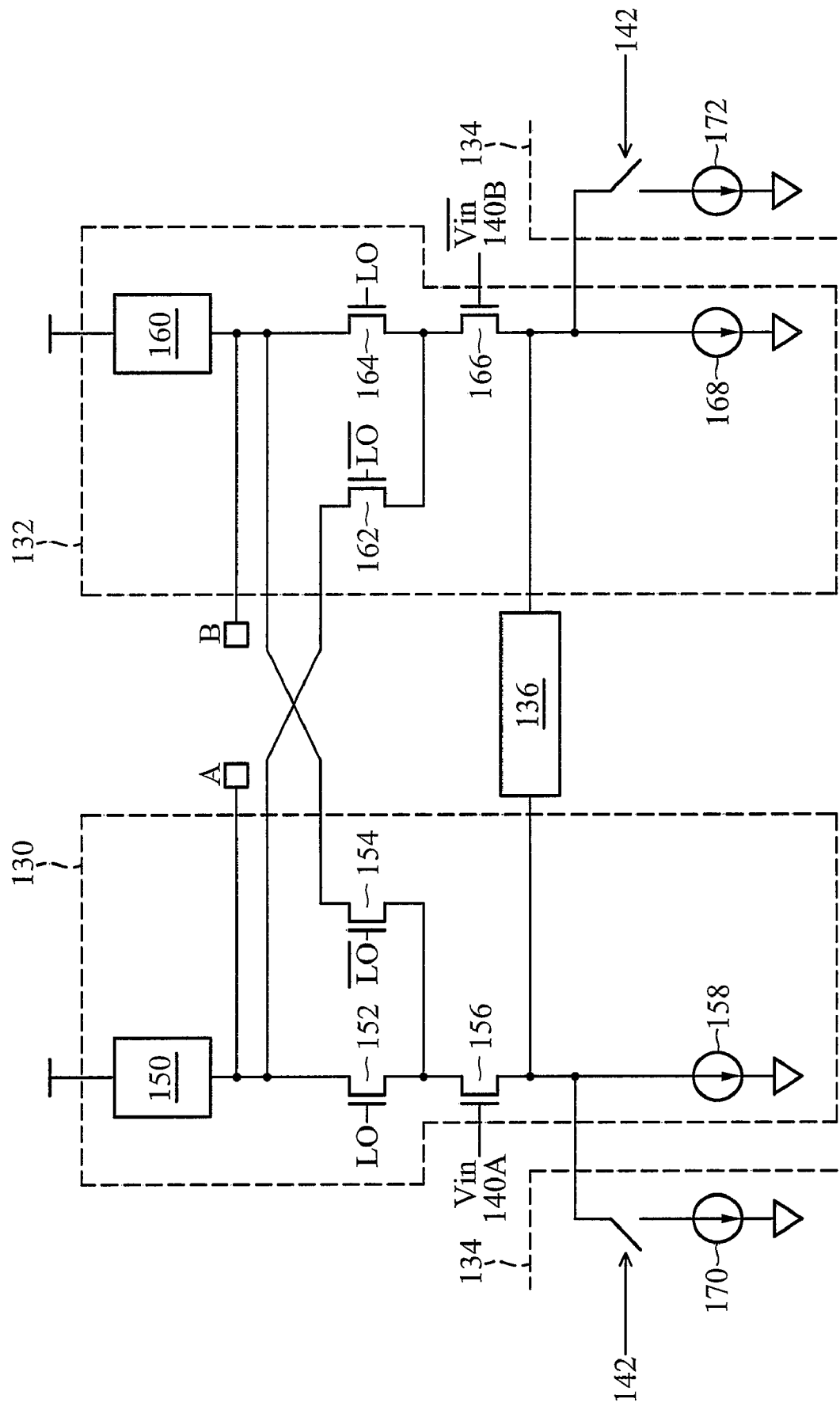
FIG. 2 is a block diagram of a conventional programmable mixer as disclosed in U.S. Pat. No. 6,801,761.
Figure 3:
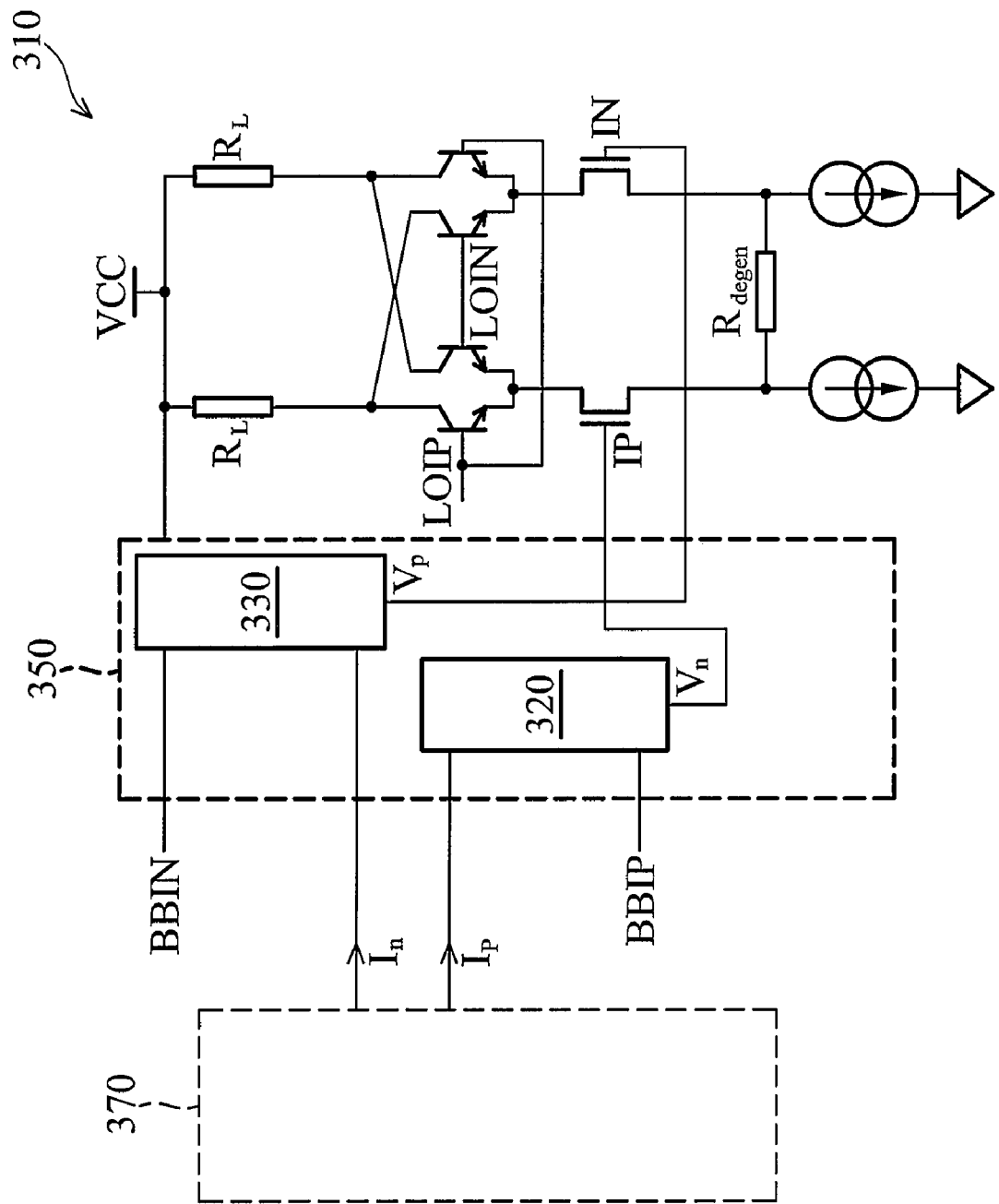
FIG. 3 is a block diagram of a mixer circuit according to an embodiment of the invention.

FIG. 3 is a block diagram of a mixer circuit according to an embodiment of the invention. The mixer circuit 300 comprises a double-balanced mixer 310 and a carrier-leakage calibration cell 350. The double-balanced mixer has input pairs LOIP/LOIN and an input pair IP/IN. The double-balanced mixer in FIG. 3 differs only from that in FIG. 1 in that differential pairs of MOSFETs are replaced by bipolar junction transistors (BJTs). The input pairs LOIP/LOIN receives a differential local oscillator signal and provides a differential output signal through load resistor $R_L$. The carrier-leakage calibration cell 350 receives a differential baseband (BB) signal and a differential calibration current Ip/In and generates first and second output voltages to the input pair IP/IN of the double-balanced mixer.

In FIG. 3, the carrier-leakage calibration cell 350 comprises first and second carrier-leakage calibration units 320 and 330. The first carrier-leakage calibration unit 320 receives one differential component BBIP of a differential baseband signal BBIP/BBIN and one differential component Ip of the differential calibration current Ip/In and generates the first output voltage Vp. The second carrier-leakage calibration unit 330 receives the other differential component BBIN of the differential baseband signal BBIP/BBIN and the other differential component In of the differential calibration current Ip/In and generates the second output voltage Vn. In FIG. 3, the mixer circuit 300 further comprises a calibration module 370 providing the differential calibration current.

Figure 4:
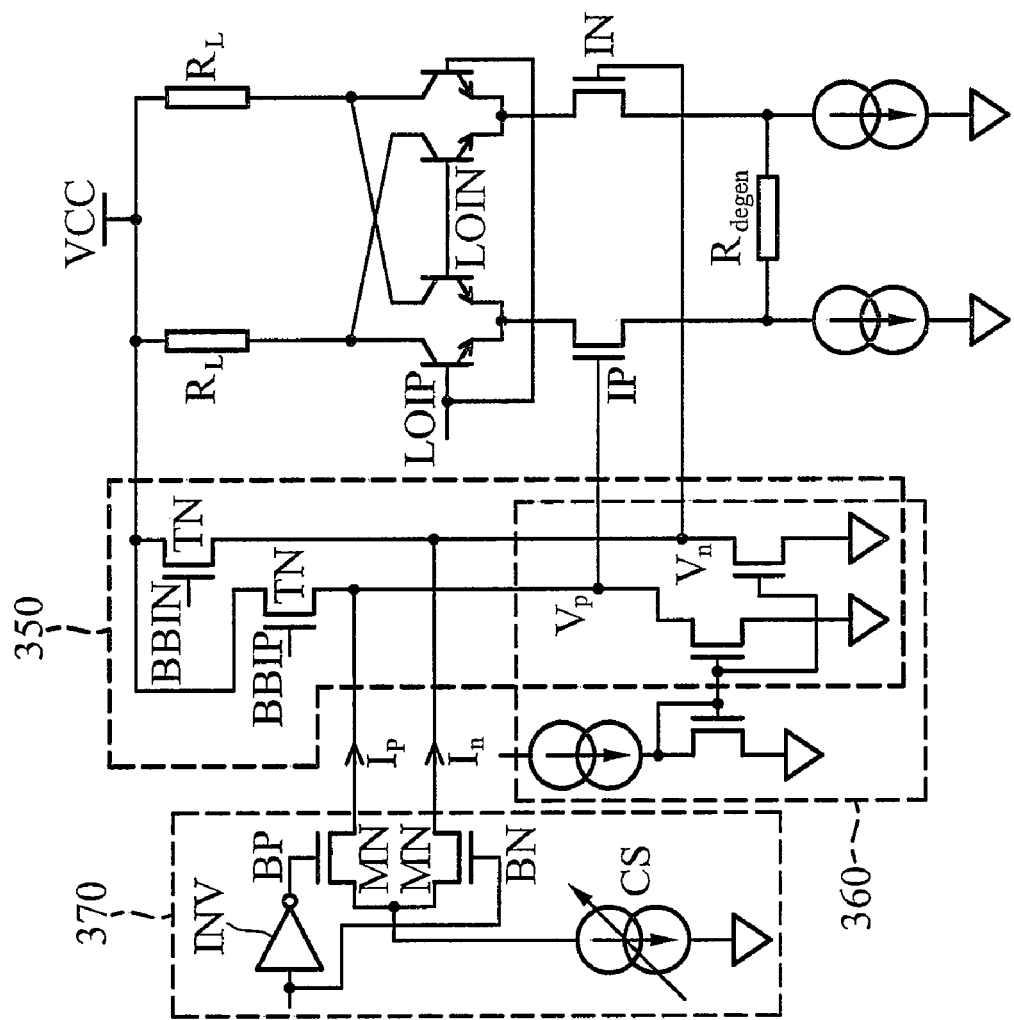
FIG. 4 is a circuit diagram of the mixer circuit in FIG. 3.

FIG. 4 is a circuit diagram of the mixer circuit in FIG. 3, wherein the first and second carrier-leakage calibration units in FIG. 3 are both source followers. Each source follower comprises a NMOS transistor TN. Gates of the NMOS transistors TN receive the differential baseband signal BBIP/BBIN and sources thereof receive the differential calibration current Ip/In. In FIG. 4, the calibration module 370 comprises first and second NMOS transistors MN. Sources of the NMOS transistors MN are coupled to a ground via a variable current source CS and gates thereof respectively controlled by first and second control bits BP and BN. Drains of the NMOS transistors MN provide the differential calibration current Ip/In. In FIG. 4, an inverter INV receives the second control bit BN and generates the first control bit BP.

Figure 5:
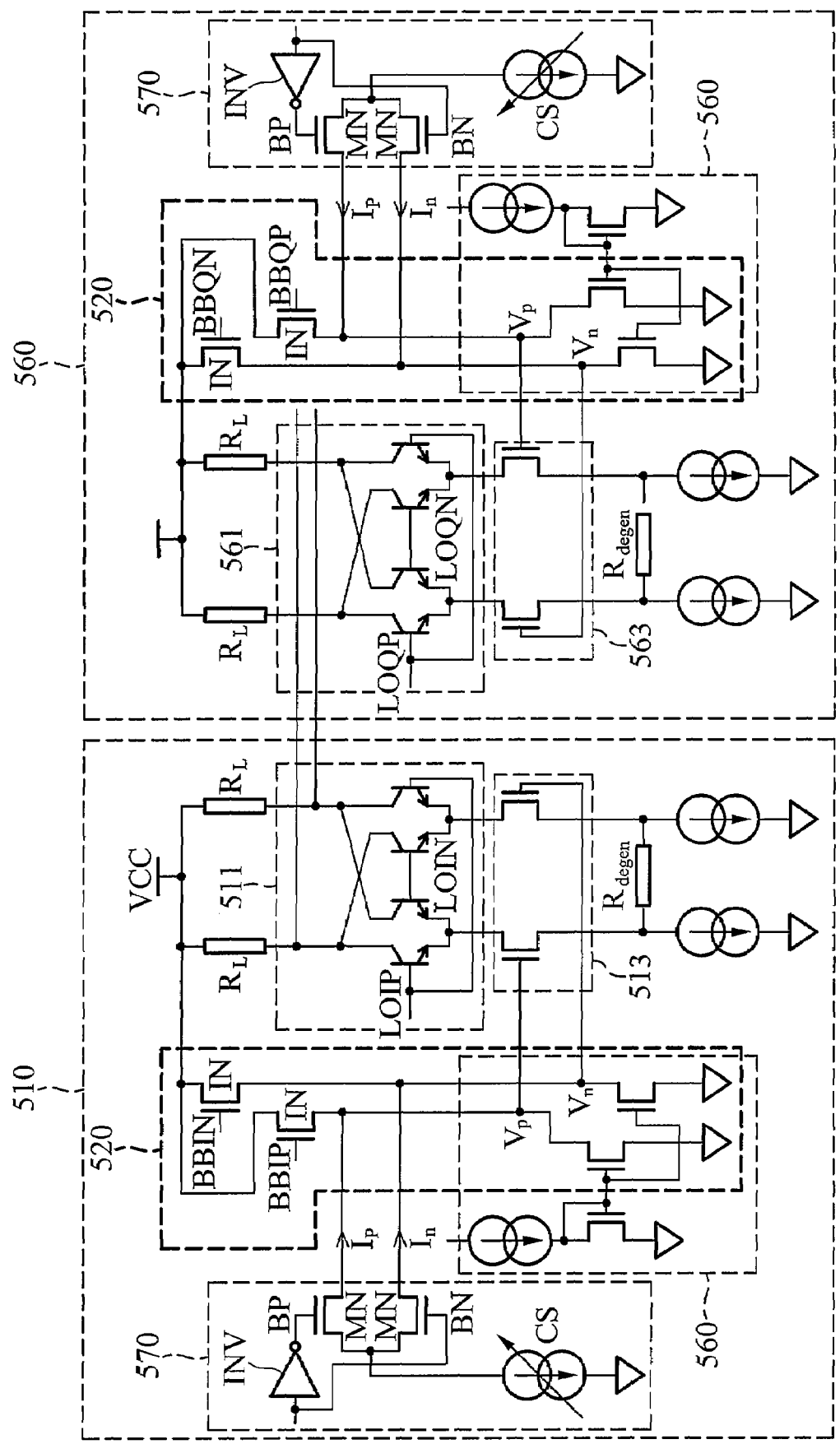
FIG. 5 is a circuit diagram of a quadrature mixer circuit according to an embodiment of the invention.

FIG. 5 is a circuit diagram of a quadrature mixer circuit according to an embodiment of the invention. The quadrature mixer circuit 500 comprises an I-Quad mixer 510 and a Q-Quad mixer 560. The I-Quad mixer 510 and the Q-Quad mixer 560 are mixer circuits as disclosed in FIG. 4 and connected in parallel between a supply voltage Vcc and a ground GND. The Gilbert mixer's switch-quad 511 in the I-Quad mixer 510 receives a local oscillator signal LOIP/LOIN and that in the Q-Quad mixer 560 a local oscillator signal LOQP/LOQN. The transconductor cell 513 in the I-Quad mixer 510 receives voltage signals VIP/VIN from the carrier-leakage calibration cell 520 and that in the Q-Quad mixer 560 voltage signals VQP/VQN from the carrier-leakage calibration cell 570. The I-Quad mixer 510 generates an output RF signal RFIP/RFIN and the Q-Quad mixer 760 an RF signal RFQP/RFQN. In this embodiment, the voltage followers in the carrier-leakage calibration cells 520 and 570 consume little amount of current, therefore its contribution to the current consumption of the quadrature mixer circuit 500 is negligible. In addition, compensating at the source followers does not significantly alter the transconductance characteristics of I-Quad mixer 510 and Q-Quad mixer 560. Differences between these two mixers can degrade the sideband-suppression performance.

Embodiments according to the invention provide a mixer circuit with carrier-leakage calibration. In the embodiments, local oscillator (LO) signal coupling to a differential output signal of the mixer circuit is significantly suppressed. In addition, carrier-leakage calibration has negligible degradation in the matching between I-Quad mixer and Q-Quad mixer in a quadrature mixer circuit.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A mixer circuit receiving first and second differential input signals and generating a differential output signal, comprising:
    a double-balanced mixer having first and second input pairs and an output pair, wherein the first input pair receives the first differential input signal and the output pair provides the differential output signal; and
    a carrier-leakage calibration cell receiving the second differential input signal and a differential calibration current for calibrating voltage and generating first and second output voltages to the second input pair of the double-balanced mixer.

2. The mixer circuit as claimed in claim 1, wherein the carrier-leakage calibration cell comprises a first carrier-leakage calibration unit receiving one differential component of the second differential input signal and one differential component of the differential calibration current and generating the first output voltage and a second carrier-leakage calibration unit receiving the other differential component of the second differential input signal and the other differential component of the differential calibration current and generating the second output voltage.

3. The mixer circuit as claimed in claim 2, wherein the first and second carrier-leakage calibration units comprise source followers having gates receiving the second differential input signal and sources receiving the differential calibration current.

4. The mixer circuit as claimed in claim 1, further comprising a calibration module providing the differential calibration current.

5. The mixer circuit as claimed in claim 4, wherein the calibration module comprises first and second MOS transistors having sources coupled to a fixed voltage via a variable current source, gates respectively controlled by first and second control bits and drains providing the differential calibration current, wherein the second control bit is a complement of the first control bit.

6. A quadrature mixer circuit, comprising:
    first and second mixer circuits each receiving first and second differential input signals and generating a differential output signal, each comprising:
        a double-balanced mixer having first and second input pairs and an output pair, wherein the first input pair receives the first differential input signal and the output pair provides the differential output signal; and
        a carrier-leakage calibration cell receiving the second differential input signal and a differential calibration current for calibrating voltage and generating first and second output voltages to the second input pair of the double-balanced mixer;
    wherein the first differential signals of the first and second mixer circuits are of a 90° phase difference.

7. The mixer circuit as claimed in claim 6, wherein each of the carrier-leakage calibration cells comprises a first carrier-leakage calibration unit receiving one differential component of the second differential input signal and one differential component of the differential calibration current and generating the first output voltage and a second first carrier-leakage calibration unit receiving the other differential component of the second differential input signal and the other differential component of the differential calibration current and generating the second output voltage.

8. The quadrature mixer circuit as claimed in claim 7, wherein the first and second carrier-leakage calibration units comprise both source followers having gates receiving the second differential input signal and sources receiving the differential calibration current.

9. The quadrature mixer circuit as claimed in claim 6, further comprising a calibration module providing the differential calibration current.

10. The quadrature mixer circuit as claimed in claim 9, wherein the calibration module comprises first and second MOS transistors having sources coupled to a fixed voltage via a variable current source, gates respectively controlled by first and second control bits and drains providing the differential calibration current, wherein the second control bit is a complement of the first control bit.

* * * * *